United States Patent
Chang et al.

(10) Patent No.: US 11,917,841 B2
(45) Date of Patent: Feb. 27, 2024

(54) LIGHT-EMITTING DEVICE COMPRISING ORGANIC SALT BOUND TO QUANTUM DOTS AND PRODUCTION METHOD THEREOF

(71) Applicant: SAMSUNG ELECTRONICS CO., LTD., Suwon-si (KR)

(72) Inventors: Jaejun Chang, Gwacheon-si (KR); Kwanghee Kim, Seoul (KR); Won Sik Yoon, Seoul (KR); Eun Joo Jang, Suwon-si (KR); Oul Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 255 days.

(21) Appl. No.: 17/123,292

(22) Filed: Dec. 16, 2020

(65) Prior Publication Data
US 2021/0184147 A1    Jun. 17, 2021

(30) Foreign Application Priority Data
Dec. 16, 2019   (KR) .......................... 10-2019-0168242

(51) Int. Cl.
*H10K 50/115*     (2023.01)
*H10K 50/11*      (2023.01)
(Continued)

(52) U.S. Cl.
CPC .......... *H10K 50/115* (2023.02); *H10K 50/11* (2023.02); *H10K 50/15* (2023.02); *H10K 2101/40* (2023.02)

(58) Field of Classification Search
None
See application file for complete search history.

(56) References Cited

U.S. PATENT DOCUMENTS

| 6,645,645 B1 | 11/2003 | Adachi et al. |
| 7,700,200 B2 | 4/2010 | Vladimir et al. |
| (Continued) | | |

FOREIGN PATENT DOCUMENTS

| EP | 2621599 A1 | 8/2013 |
| JP | 2014049469 A | 3/2014 |
| (Continued) | | |

OTHER PUBLICATIONS

Yim et al., Enhanced light emission from one-layered organic light-emitting devices doped with organic salt by simultaneous thermal and electrical annealing, Applied Physics Letters, 89, 103507 (2006), Published online: Sep. 6, 2006.*
(Continued)

*Primary Examiner* — Daniel Whalen
(74) *Attorney, Agent, or Firm* — CANTOR COLBURN LLP

(57) ABSTRACT

A light-emitting device including a first electrode, a second electrode, and a light-emitting film disposed between the first electrode and the second electrode, and a method of producing the device. The light-emitting film includes a fluorine-containing organic salt, and quantum dots that do not include cadmium, lead, or a combination thereof, and the fluorine-containing organic salt includes a substituted or unsubstituted C1 to C30 hydrocarbon group, a non-metallic element, fluorine, and at least one of boron or phosphorus, and the non-metallic element includes carbon, nitrogen, oxygen, phosphorus, sulfur, or selenium.

22 Claims, 2 Drawing Sheets

(51) Int. Cl.
 H10K 50/15 (2023.01)
 H10K 101/40 (2023.01)

(56) References Cited

U.S. PATENT DOCUMENTS

| | | | |
|---|---|---|---|
| 8,120,010 | B2 | 2/2012 | Cho et al. |
| 8,330,142 | B2 | 12/2012 | Cho et al. |
| 8,685,781 | B2 | 4/2014 | Semonin et al. |
| 9,324,562 | B1 | 4/2016 | Luther et al. |
| 9,492,840 | B2 | 11/2016 | Lee et al. |
| 9,644,077 | B2 | 5/2017 | Shim et al. |
| 9,653,630 | B2 | 5/2017 | Suh et al. |
| 9,925,568 | B2 | 3/2018 | Lee et al. |
| 9,972,802 | B2 | 5/2018 | Ikemizu et al. |
| 2005/0274944 | A1 | 12/2005 | Jang et al. |
| 2008/0290797 | A1 | 11/2008 | Park et al. |
| 2009/0039764 | A1 | 2/2009 | Cho et al. |
| 2012/0032138 | A1 | 2/2012 | Kim et al. |
| 2013/0277669 | A1 | 10/2013 | Krebs et al. |
| 2014/0014896 | A1 | 1/2014 | Chung et al. |
| 2015/0076494 | A1 | 3/2015 | Pickett et al. |
| 2018/0105739 | A1 | 4/2018 | Kim et al. |
| 2018/0179441 | A1* | 6/2018 | Park ............ H10K 59/38 |
| 2019/0169500 | A1* | 6/2019 | Kim ............ H10K 50/115 |
| 2019/0276734 | A1* | 9/2019 | Kim ............ H01L 27/3244 |
| 2019/0276737 | A1 | 9/2019 | Won |
| 2020/0075877 | A1* | 3/2020 | Yu ............ H10K 50/115 |
| 2020/0224095 | A1 | 7/2020 | Hong et al. |

FOREIGN PATENT DOCUMENTS

| | | |
|---|---|---|
| KR | 20100095875 A | 9/2010 |
| KR | 1447238 B1 | 9/2014 |
| KR | 20140143406 A | 12/2014 |
| KR | 20150063929 A | 6/2015 |
| KR | 20150121355 A | 10/2015 |
| KR | 20190106819 A | 9/2019 |
| KR | 10-2046907 B1 | 11/2019 |
| WO | 2015036762 A1 | 4/2012 |
| WO | 2015036762 A1 | 3/2015 |

OTHER PUBLICATIONS

Extended European Search Report dated May 18, 2021, of the corresponding European Patent Application No. 20214544.7.
Bulovic et al., Nature 2000, 420, 800-803.
Byoung-Ho Kang, et al., "Efficient exciton generation in atomic passivated CdSe/ZnS quantum dots light-emitting devices", Scientific Reports, 6:34659 (2016).
E. Jang et al. "White-Light-Emitting Diodes with Quantum Dot ColorConverters for Display Backlights", Adv. Mater. 2010, 22, 3076-3080.
N. S. Kurochkina, et al., ISSN 1063 Semiconductors,2015, vol. 49, No. 7, pp. 953-958.
T.-H. Kim et al., "Full-colour quantum dot displays fabricated bytransfer printing", Nature Photon. 2011, 5, 176-182.
Xingliang Dai, et al., "Solution-processed, high-performance light-emitting diodes based on quantum dots", Nature, vol. 515, Nov. 6, 2014, 15 pp.
Young Ran Park, et al., "Quantum-Dot Light-Emitting Diodes with Nitrogen-Doped Carbon Nanodot Hole Transport and Electronic Energy Transfer Layer", Scientific Reports, 7:46422 , 2017, 13 pp.
English translation of Office Action dated Dec. 20, 2023 of the corresponding Korean Patent Application No. 10-2019-0168242, 12 pp.
Office Action dated Dec. 20, 2023 of the corresponding Korean Patent Application No. 10-2019-0168242, 10 pp.

* cited by examiner

LIGHT-EMITTING DEVICE COMPRISING ORGANIC SALT BOUND TO QUANTUM DOTS AND PRODUCTION METHOD THEREOF

CROSS-REFERENCE TO RELATED APPLICATION

This application claims priority to Korean Patent Application No. 10-2019-0168242 filed in the Korean Intellectual Property Office on Dec. 16, 2019, and all the benefits accruing therefrom under 35 U.S.C. § 119, the content of which in its entirety is incorporated herein by reference.

BACKGROUND

1. Field

A light-emitting device, a method of producing the device, and a light-emitting film included in the device are disclosed.

2. Description of the Related Art

A quantum dot (or quantum dots) is a type of material based on a semiconductor nanocrystal. The quantum dot may exhibit an energy bandgap varying by controlling a size and/or a composition thereof. The quantum dot may emit light of various emission wavelengths, and therefore, may be applied to various electronic devices.

SUMMARY

An embodiment provides an (electro)luminescent device including quantum dots having improved properties.

Another embodiment provides a method of producing the light-emitting device.

Another embodiment provides a light-emitting film that is included in the light-emitting device.

A light-emitting device according to an embodiment includes a first electrode, a second electrode (e.g., spaced from one another or facing each other), and a light-emitting film disposed between the first electrode and the second electrode, wherein the light-emitting film includes a fluorine-containing organic salt and quantum dots, wherein the quantum dots do not include cadmium, lead, or a combination thereof, wherein the fluorine-containing organic salt (e.g., onium salt) includes a substituted or unsubstituted C1 to C30 hydrocarbon group, a non-metallic element (e.g., being capable of forming an onium salt or an onium moiety), fluorine, and at least one of boron or phosphorus (e.g., boron, phosphorous, or a combination thereof), and wherein the non-metallic element includes carbon, nitrogen, oxygen, phosphorus, sulfur, or selenium.

The light-emitting film may be configured to emit light (e.g., red light, green light, or blue light).

A HOMO energy level of the light-emitting film may be greater than or equal to about 5.7 electron volts (eV), greater than or equal to about 5.75 eV, greater than or equal to about 5.8 eV, or greater than or equal to about 5.85 eV. The HOMO energy level may be measured using a photoelectron spectroscopy analysis.

The HOMO energy level of the light-emitting film may be greater than or equal to about 5.9 eV.

In an embodiment, the light-emitting film emits red light, and the HOMO energy level of the light-emitting film may be greater than or equal to about 5.7 eV, greater than or equal to about 5.75 eV, greater than or equal to about 5.8 eV, or greater than or equal to about 5.85 eV.

In an embodiment, the light-emitting film emits green light, and the HOMO energy level of the light-emitting film may be greater than or equal to about 5.7 eV, greater than or equal to about 5.75 eV, greater than or equal to about 5.8 eV, or greater than or equal to about 5.85 eV.

In an embodiment, the light-emitting film emits blue light, and the HOMO energy level of the light-emitting film may be greater than or equal to about 5.9 eV.

The quantum dots may constitute at least a portion of a surface of the light-emitting film. The fluorine-containing organic salt may be bound to the quantum dots. At least a portion of a surface of the light-emitting film may include the quantum dots and the fluorine-containing organic salt bound to the quantum dots.

The fluorine-containing organic salt may include a carbonium moiety, an oxonium moiety, an ammonium moiety, a phosphonium moiety, a selenonium moiety, a sulfonium moiety, or a combination thereof.

The fluorine-containing organic salt may include a fluoroborate, a fluorophosphate, or a combination thereof.

The quantum dots may have a core shell structure.

In an embodiment, the quantum dots (or the core shell structure) may include a core including a first semiconductor nanocrystal and a shell disposed on the core, the shell including a second semiconductor nanocrystal having a composition different from that of the first semiconductor nanocrystal.

The first semiconductor nanocrystal and the second semiconductor nanocrystal may independently include a Group II-VI compound, a Group III-V compound, a Group IV-VI compound, a Group IV element or compound, a Group I-III-VI compound, a Group I-II-IV-VI compound, or a combination thereof.

The first semiconductor nanocrystal may include indium, zinc, or a combination thereof.

The quantum dots may include zinc and sulfur in an outermost layer of the shell.

The quantum dots may include InP, InZnP, ZnSe, ZnSeTe, or a combination thereof.

The light-emitting film may include boron. A mole ratio of boron relative to carbon may be greater than or equal to about 0.001:1, as determined by energy dispersive spectroscopy of the light-emitting film.

In the light-emitting film, the mole ratio of boron relative to carbon may be greater than or equal to about 0.1:1, or greater than or equal to about 0.5:1, as determined by energy dispersive spectroscopy of the light-emitting film.

In the light-emitting film, a molar amount of fluorine relative to carbon may be greater than or equal to about 0.5%, greater than or equal to about 1%, greater than or equal to about 2%, greater than or equal to about 3%, greater than or equal to about 5%, greater than or equal to about 10%, for example, as determined by energy dispersive spectroscopy of the light-emitting film. In the light-emitting film, a molar amount of fluorine relative to carbon may be less than or equal to about 50%, less than or equal to about 40%, less than or equal to about 30%, less than or equal to about 20%, or less than or equal to about 10%.

The light-emitting film may include boron, and a mole ratio of fluorine relative to boron may be greater than or equal to about 4:1 and less than or equal to about 6:1, for example, as determined by energy dispersive spectroscopy of the light-emitting film.

The light-emitting film may include boron, and a mole ratio of fluorine relative to boron may be greater than or equal to about 0.03:1 and less than or equal to about 4:1.

The quantum dots may include zinc and a chalcogen element, and a mole ratio of carbon relative to total moles of the zinc and the chalcogen element may be less than or equal to about 8:1, for example, as determined by energy dispersive spectroscopy of the light-emitting film.

The mole ratio of carbon relative to a total moles of the zinc and chalcogen element may be less than or equal to about 7:1.

The light-emitting device may further include an electron auxiliary layer adjacent to the light-emitting film.

A difference between a conduction band edge (e.g., a LUMO energy) level of the electron auxiliary layer and a LUMO level of the light-emitting film may be less than or equal to about 1 eV.

The electron auxiliary layer may include nanoparticles of a metal oxide.

The metal oxide may include zinc oxide, zinc magnesium oxide, tin oxide, titanium oxide, or a combination thereof.

The metal oxide may be represented by Chemical Formula 1:

$$Zn_{1-x}M_xO \qquad \text{Chemical Formula 1}$$

In Chemical Formula 1,

M is Mg, Ca, Zr, W, Li, Ti, Y, Al, or a combination thereof, and $0 \leq x \leq 0.5$.

The nanoparticles may have an average particle size of greater than or equal to about 0.5 nanometers (nm) and less than or equal to about 10 nm.

The light-emitting film may have a thickness of greater than or equal to about 10 nm and less than or equal to about 100 nm.

After a heat treatment at 120° C. for 30 minutes, the light-emitting film may have photoluminescence efficiency that is greater than or equal to about 93% of a photoluminescence efficiency thereof prior to the heat treatment.

The light-emitting device may have a maximum external quantum efficiency of greater than or equal to about 10%.

The light-emitting device may have a maximum luminance of greater than or equal to about 35,000 candela per square meter ($cd/m^2$).

The light-emitting device may exhibit a T95 life span that is greater than or equal to about 2 hours as measured under its operation at a brightness of about 650 $cd/m^2$ or lower.

The light-emitting device may further include a hole auxiliary layer, for example a hole injecting layer (HIL), a hole transporting layer (HTL), or a combination thereof, the hole auxiliary layer being disposed between the first electrode and the light-emitting film.

The light-emitting device may further include an electron auxiliary layer, for example an electron injecting layer (EIL), an electron transporting layer (ETL), or a combination thereof, the electron auxiliary layer being disposed between the second electrode and the light-emitting film.

In another embodiment, a method of producing the aforementioned light-emitting device includes:
providing a structure including a first electrode and a second electrode, and a light-emitting film between the first electrode and the second electrode (e.g., providing a first electrode, forming a light emitting layer on the first electrode, and forming a second electrode on the light emitting layer),
wherein the forming of the light-emitting film includes
providing a quantum dot layer including a plurality of quantum dots, and treating the quantum dot layer with a solution including a fluorine-containing organic salt in a polar solvent.

The method may further include washing the treated quantum dot layer one or more times with a polar solvent.

The method may further include heat-treating the washed quantum dot layer at a temperature of greater than or equal to about 80° C.

The polar solvent may include a C1 to C10 alcohol.

Another embodiment provides a display device including the aforementioned light-emitting device (e.g., electroluminescent device).

In another embodiment, a light-emitting film includes a plurality of quantum dots and a fluorine-containing organic salt, wherein the plurality of quantum dots do not include cadmium, lead, or a combination thereof, and the fluorine-containing organic salt includes a first moiety including oxonium, ammonium, carbonium, phosphonium, selenonium, sulfonium, or a combination thereof, and a second moiety including tetrafluoroborate, hexafluorophosphate, or a combination thereof.

The first moiety may include a substituted or unsubstituted C1 to C30 hydrocarbon group.

The HOMO energy level of the light-emitting film may be greater than or equal to about 5.7 eV.

The HOMO energy level of the light-emitting film may be greater than or equal to about 5.8 eV.

The HOMO energy level of the light-emitting film may be greater than or equal to about 5.9 eV.

The light-emitting film may have a hole transport capability measured at a predetermined voltage (e.g., at 8 Volts) of greater than or equal to about 300 milliampere per square centimeter ($mA/cm^2$), greater than or equal to about 400 $mA/cm^2$, greater than or equal to about 450 $mA/cm^2$, or greater than or equal to about 500 $mA/cm^2$.

The light-emitting film may be configured to emit red light, green light, or blue light.

In an embodiment, the light-emitting film emits red light, and the HOMO energy level of the light-emitting film may be greater than or equal to about 5.7 eV.

In an embodiment, the light-emitting film emits green light, and the HOMO energy level of the light-emitting film may be greater than or equal to about 5.7 eV.

In an embodiment, the light-emitting film emits blue light, and the HOMO energy level of the light-emitting film may be greater than or equal to about 5.9 eV.

The HOMO energy level of the light-emitting film may be greater than or equal to about 6.0 eV.

The light-emitting film may include boron, and a mole ratio of boron relative to carbon may be greater than or equal to about 0.001:1, greater than or equal to about 0.01:1, greater than or equal to about 0.05:1, greater than or equal to about 0.1:1, or greater than or equal to about 0.5:1, for example, as determined by an energy dispersive spectroscopy of the light-emitting film.

The boron content relative to 1 mole of carbon may be greater than or equal to about 0.5 mole.

In the energy dispersive spectroscopy of the light-emitting film, a mole content of fluorine relative to carbon may be greater than or equal to about 0.5%.

The quantum dots may include zinc and a chalcogen element and in the energy dispersive spectroscopy of the light-emitting film, a mole ratio of carbon relative to a total content of the zinc and chalcogen element may be less than or equal to about 8.

The mole ratio of carbon relative to a total content of the zinc and a chalcogen element may be less than or equal to about 7. In the light-emitting device (for example, an electroluminescent device) of an embodiment, the fluorine-containing organic salt passivates the quantum dot-based light-emitting film (e.g., a light-emitting layer), and may improve optical properties of the quantum dots in the light-emitting layer to increase life-span of the device.

DETAILED DESCRIPTION

Figure 1:
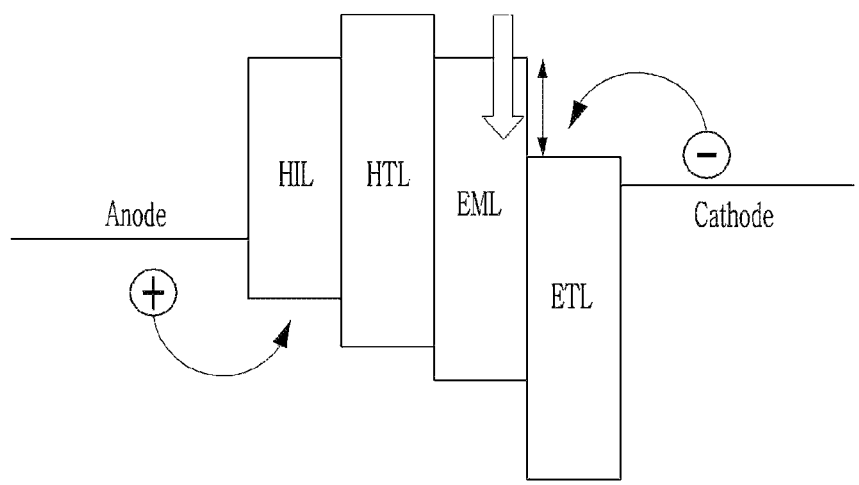
FIG. 1 is a schematic view showing energy levels of each layer in a light-emitting device according to a non-limiting embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

If not defined otherwise, all terms in the specification (including technical and scientific terms) are used as commonly understood by a person of ordinary skilled in the art. It will be further understood that terms, such as those terms defined in a common dictionary should be interpreted as having a meaning that is consistent with their meaning in the context of the relevant art, and may not be interpreted ideally or exaggeratedly unless clearly defined. The terminology used herein is for the purpose of describing particular embodiments and is not intended to be limiting.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprise" and variations such as "comprises", "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. In order to clearly illustrate the embodiments in the drawings, some portions not really relevant to the explanation may be omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, ±5% of the stated value.

As used herein, when a definition is not otherwise provided, "substituted" refers to the case where in a compound or a functional group, hydrogen is replaced by a substituent that is a C1 to C30 an alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxylic acid group or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, "Group" in the terms of Group II, Group III, and the like refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

As used herein, a hydrocarbon group refers to a group including (or consisting of) carbon and hydrogen (e.g., an alkyl, alkenyl, alkynyl, or aryl group). The hydrocarbon group may be a group having a valence of one or greater formed by removal of a, e.g., at least one, hydrogen atom from alkane, alkene, alkyne, or arene. In the hydrocarbon group, a, e.g., at least one, methylene may be replaced by an oxide moiety, a carbonyl moiety, an ester moiety, —NH—, or a combination thereof.

Herein, "aliphatic" may refers to a saturated or unsaturated linear or branched hydrocarbon group. An aliphatic group may be an alkyl, alkenyl, or alkynyl group, for example.

As used herein, "alkyl" refers to a linear or branched saturated monovalent hydrocarbon group (methyl, ethyl, hexyl, etc.). As used herein, "alkenyl" refers to a linear or branched monovalent hydrocarbon group having one or more carbon-carbon double bond. As used herein, "alkynyl" refers to a linear or branched monovalent hydrocarbon group having one or more carbon-carbon triple bond.

Herein, "aromatic" refers to an organic compound or group comprising a, e.g., at least one, unsaturated cyclic group having delocalized pi electrons. The term encompasses both hydrocarbon aromatic compounds and heteroaromatic compounds. As used herein, "aryl" refers to a group formed by removal of a, e.g., at least one, hydrogen from an aromatic hydrocarbon (e.g., a phenyl or naphthyl group). As used herein, "hetero" refers to one including one or more (e.g., 1 to 3) heteroatom of N, O, S, Si, P, or a combination thereof.

Hereinafter, values of a work function, a conduction band, or a LUMO (or valence band or HOMO) energy level is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

In an embodiment, the HOMO energy level and/or the LUMO energy level recited herein may be a value measured by photo-electron spectroscopy in air (e.g., photoelectron spectrophotometer, model name AC3 manufactured by Riken Keiki Co. Ltd.) or a value measured by using UPS (UV absorption (Optical band-gap)).

In a measurement involving the photoelectron spectroscopy analysis, when the photoelectron output is plotted on an X/Y axis, with horizontal axis as the UV energy applied, and the vertical axis as a standardized photoelectron yield ration, the result is a curved line rising with a specific slope of degree and the HOMO level is a value at which the base line meets a straight and extending line obtained from the dots in a region of the increasing slope. The standardized photoelectron yield ration, (Yield)$^n$ is the ratio of photoelectron yield achieved per unit of UV energy applied to the sample surface, and "n" represents the strength of the UV energy applied and the "n" value is from about 0.3 to 1 (e.g., 0.33).

The quantum yield (QY) may be readily and reproducibly determined by using commercially available equipment, for example, from Hitachi Co. Ltd or Hamamatsu Co. Ltd and referring to the instruction manuals provided from the manufacturer. In an embodiment, the quantum efficiency may be determined by any method known to those of ordinary skill in the art. For example, a quantum efficiency may be measured by an absolute method or a relative method. The absolute method directly obtains the quantum yield by detecting all sample fluorescence for example through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescent wavelengths, but are not limited thereto.

The term "average" used in this disclosure (e.g., an average size of the quantum dot) may be a mean or a median. In an embodiment, the average may be a "mean" average.

As used herein, the expression "not including cadmium (or other harmful heavy metal)" may refer to the case in which a concentration of cadmium (or a harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

Quantum dots may contribute to increased luminous efficiency and improved color reproducibility of a light-emitting device when present as a light-emitting material. The electroluminescent-based display device (hereinafter, electroluminescent display device) may be driven without an external light source. The electroluminescent display device includes a light-emitting device including an electroluminescence material in the light-emitting device, electrons and holes each injected from a first electrode and a second electrode are combined in the light-emitting layer to form an exciton, and the exciton emits light. (see FIG. 1)

Hereinafter, a light-emitting device according to an embodiment is explained with reference to the drawings.

Figure 2:
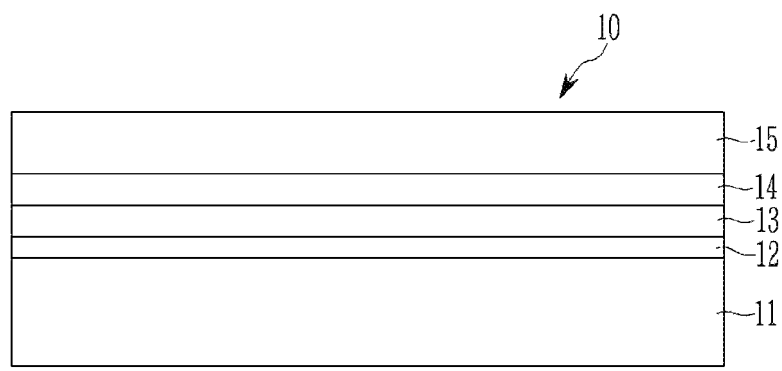
FIG. 2 is a cross-sectional representation of a light-emitting device according to a non-limiting embodiment.

FIG. 2 is a cross-sectional representation of a light-emitting device according to a non-limiting embodiment. Referring to FIG. 2, the light-emitting device 10 according to an embodiment includes electrodes (first electrode and second electrode) spaced apart and each with a surface opposite the other, and a light-emitting film 13 including a plurality of quantum dots disposed between the electrodes. A charge auxiliary layer may be disposed between the light-emitting film 13 and the electrodes. If the first electrode 11 is an anode and the second electrode 15 is a cathode, a hole auxiliary layer 12 that assists movement (transport/injection) of holes may be disposed between the first electrode and the light-emitting film and an electron auxiliary layer 14 that assists movement (transport/injection) of electrons may be disposed between the second electrode and the light-emitting film.

In an embodiment, the light-emitting device may include a substrate (not shown). The substrate may be disposed on the first electrode 11 (e.g., a major surface of the first electrode 11) or may be disposed on the second electrode 15 (e.g., a major surface of the second electrode 15). In an embodiment, the substrate may be disposed on an opposite side of the first electrode (e.g., under the first electrode) in FIG. 2. In an embodiment, the substrate may be disposed on an opposite side of the second electrode 15 (e.g., above the second electrode) in FIG. 2. The substrate may be a substrate including an insulation material (e.g., insulating transparent substrate). The substrate may include glass; various polymers such as polyester (e.g., polyethylene terephthalate (PET), polyethylene naphthalate (PEN)), polycarbonate, poly(meth)acrylate, polyimide, and poly(amide-imide); polysiloxane (e.g. PDMS); inorganic materials such as silicon, silicon oxide, and $Al_2O_3$; or a combination thereof, but is not limited thereto. Herein "transparent" refers to transmittance for light in a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected considering a substrate material, and the like, but is not particularly limited. The transparent substrate may have flexibility. The substrate may be omitted.

One of the first electrode 11 or the second electrode 15 may be an anode and the other may be a cathode. For example, the first electrode 11 may be an anode, and the second electrode 15 may be a cathode and vice versa.

The first electrode 11 may be made of a conductor, for example a metal, a conductive metal oxide, or a combination thereof. The first electrode 11 may be for example made of a metal, such as nickel, platinum, vanadium, chromium, copper, zinc, and gold, or an alloy thereof; a conductive metal oxide, such as zinc oxide, indium oxide, tin oxide, indium tin oxide (ITO), indium zinc oxide (IZO), or fluorine doped tin oxide; or a combination of metal and oxide, such as ZnO and Al or $SnO_2$ and Sb; and the like, but is not limited thereto. In an embodiment, the first electrode may include a transparent conductive metal oxide, for example, indium tin oxide. A work function of the first electrode may be higher than a work function of the second electrode that will be described later. A work function of the first electrode may be lower than a work function of the second electrode that will be described later.

The second electrode 15 may be made of a conductor, for example a metal, a conductive metal oxide, and/or a conductive polymer. The second electrode 15 may be for example a metal, such as aluminum, magnesium, calcium, sodium, potassium, titanium, indium, yttrium, lithium, gadolinium, silver, tin, lead, cesium, or barium, or an alloy thereof; a multi-layer structured material, such as LiF/Al, $Li_2O$/Al, Liq/Al, LiF/Ca, and $BaF_2$/Ca, but is not limited thereto. In an embodiment, the second electrode may include a transparent conductive metal oxide, such as indium tin oxide. The conductive metal oxide is the same as described above.

In an embodiment, a work function of the first electrode (e.g., anode) may be greater than or equal to about 4.0 electron volts (eV), greater than or equal to about 4.1 eV, greater than or equal to about 4.2 eV, greater than or equal to about 4.3 eV, greater than or equal to about 4.4 eV, greater than or equal to about 4.5 eV, greater than or equal to about 4.6 eV, greater than or equal to about 4.7 eV, or greater than or equal to about 4.8 eV and less than or equal to about 5.5 eV, less than or equal to about 5.4 eV, less than or equal to about 5.3 eV, less than or equal to about 5.2 eV, less than or equal to about 5.1 eV, less than or equal to about 5.0 eV, or less than or equal to about 4.9 eV, but is not limited thereto.

A work function of the second electrode (e.g., cathode) may be greater than or equal to about 3.4 eV, for example greater than or equal to about 3.5 eV, greater than or equal to about 3.6 eV, greater than or equal to about 3.7 eV, greater than or equal to about 3.8 eV, greater than or equal to about 3.9 eV, greater than or equal to about 4.0 eV, greater than or equal to about 4.1 eV, greater than or equal to about 4.2 eV, greater than or equal to about 4.3 eV, greater than or equal to about 4.4 eV, or greater than or equal to about 4.5 eV and less than or equal to about 5.0 eV, less than or equal to about 4.9 eV, less than or equal to about 4.8 eV, less than or equal to about 4.7 eV, less than or equal to about 4.6 eV, less than or equal to about 4.5 eV, or less than or equal to about 4.4 eV, but is not limited thereto.

At least one of the first electrode 11 and the second electrode 15 may be a light-transmitting electrode, and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. If one of the first electrode 11 or the second electrode 15 is a non-light-transmitting electrode, the electrode may be made of for example an opaque conductor such as aluminum (Al), silver (Ag), or gold (Au).

A thickness of the electrodes (the first electrode and/or the second electrode) is not particularly limited and may be appropriately selected considering device efficiency. For example, the thickness of the electrodes may greater than or equal to about 5 nanometers (nm), for example, greater than or equal to about 50 nm, or greater than or equal to about 100 nm. For example, the thickness of the electrodes may be less than or equal to about 100 μm, for example, less than or equal to about 10 um, less than or equal to about 1 um, less than or equal to about 900 nm, less than or equal to about 500 nm, less than or equal to about 400 nm, less than or equal to about 300 nm, less than or equal to about 200 nm, or less than or equal to about 100 nm.

In a device of an embodiment, the light-emitting film includes a fluorine-containing organic salt and a plurality of quantum dots. As used herein, the wording "fluorine containing organic salt" may include a salt itself or a residue thereof (e.g., a residue of the fluorine containing organic salt). The quantum dots do not include cadmium, lead, or a combination thereof. The fluorine-containing organic salt includes a substituted or unsubstituted C1 to C30 (e.g., aliphatic or aromatic) hydrocarbon group, a non-metallic element (e.g., capable of forming an onium salt), fluorine, and at least one of boron and phosphorus (e.g., boron, phosphorous, or boron and phosphorous). In an embodiment, a "substituted or unsubstituted C1 to C30 hydrocarbon group" may be a C1-C30 hydrocarbon group that may be unsubstituted, or substituted with at least one substituent, for example, one or more groups having 1 to 30 carbon atoms. The non-metallic element capable of forming the onium salt includes carbon, nitrogen, oxygen, phosphorus, sulfur, or selenium. A HOMO energy level of the light-emitting film may be greater than or equal to about 5.7 eV. The onium salt may include a carbonium salt, an ammonium salt, an oxonium salt, a phosphonium salt, a sulfonium salt, or a selenonium salt, or a combination thereof.

The light-emitting film may be configured to emit red light, green light, or blue light. If the light-emitting film emits red light, the HOMO energy level of the light-emitting film may be greater than or equal to about 5.7 eV, for example, greater than or equal to about 5.8 eV, greater than or equal to about 5.85 eV, greater than or equal to about 5.9 eV, or greater than or equal to about 5.95 eV. If the light-emitting to film emits green light, the HOMO energy level of the light-emitting film may be greater than or equal to about 5.7 eV, for example, greater than or equal to about 5.8 eV, greater than or equal to about 5.85 eV, greater than or equal to about 5.9 eV, or greater than or equal to about 5.95 eV. If the light-emitting film emits blue light, the HOMO energy level of the light-emitting film may be greater than or equal to about 5.9 eV, for example, greater than or equal to about 5.95 eV, or greater than or equal to about 6.0 eV.

A quantum dot light-emitting device (hereinafter, also referred to QD-LED) may emit light by applying a voltage to the device, and includes quantum dots as a light-emitting material. A QD-LED is based on an emission principle that is different from that of an organic light emitting diode (OLED), the latter using an organic material as an emission center. The QD-LED may realize pure colors (red, green, blue) with improved color reproducibility, and therefore, has gained attention and interest as a next generation display device. A QD-LED may be produced with a reduced cost by including a solution process and may be expected to realize increased stability because it is based on an inorganic material. Accordingly, research and technology development for improving properties (e.g., optical or luminescent properties) and/or life-span characteristics of a QD-LED remains ongoing and is significant commercial interest.

In a non-limiting embodiment, an energy level diagram of the light-emitting device (e.g., electroluminescent device) having a quantum dot light-emitting layer is shown in FIG. 1. Referring to FIG. 1, during the operation of the device, a hole is injected from an anode (e.g., ITO) and may transfer over the HOMOs of the hole transporting layer (HTL) and the hole injecting layer (HIL) and arrives at the HOMO of the light-emitting layer. An electron is injected from a cathode (e.g., Al) and moves along the LUMO of the electron transporting layer (ETL) and arrives at the LUMO of the light-emitting layer, and the hole and the electron recombine in the light-emitting layer to emit light. During the operation of the light-emitting device, charge accumulation may occur due to the defects that may be present in an active region (e.g., in a light-emitting film). Charge accumulation may cause variable current-voltage (I-V) characteristics of the device that may have negative influences on device reliability or life-span characteristics.

In a QD-LED device, the quantum dots that generally have a large surface area relative to corresponding bulk compositional counterparts may be arranged in the form of a film. Accordingly, the QD-LED may tend to have defects, for example, on the quantum dot surface, at or near the interface between the hole auxiliary layer and the light-emitting film (or layer), and at or near the interface between the electron auxiliary layer and the light-emitting layer. These defects may act as a charge trap inside the device, resulting in charge accumulation and a consequent loss of luminescent character of the quantum dots. The present inventors have found that the accumulated charges may bring about a non-uniform charge distribution inside the device and undesired changes in the hole or electron resistance of the device, and thus a consequent increase in the driving voltage of the device. The result of which may be a deterioration of luminescence and operating properties of the device.

Ligand exchange of an individual quantum dot may enhance the passivation of the quantum dot surface. For example, the ligand exchange with a thiol compound may improve (photo)luminescence performance of the quantum dots. However, the present inventors have found that insulating properties of an organic ligand may further limit performance improvement of an electroluminescent device. In addition, in the electroluminescent device, the thiol ligands disposed on the surface of the quantum dot may form a disulfide bond, particularly if a voltage is applied to the device, and therefore, the thiol ligands may more easily detach from the quantum dot surface.

A halogen-based inorganic ligand may be used to further passivate the surface of an individual quantum dot. A bond between a metal exposed on the surface of the quantum dot and a halide may be expected to have a desired influence on a light-emitting property of the quantum dot. However, the present inventors have found that passivation of the quantum dots with the halogen-based inorganic ligand (e.g., a metal halide) may cause a substantial degradation (e.g. degradation of a polymer) in an adjacent structure layer (e.g., a hole transporting layer) and may have an adverse effect on the life-span characteristics of the device.

In some instances, the insertion of an insulator interlayer between a light-emitting layer and an electron transporting layer (ETL) may address an exciton quenching problem or may improve a hole-electron injection balance in the device. However, it may be technically difficult to provide a uniform thin insulating interlayer film, and with an increased thickness one can expect an increase in the electrical resistance, which again may have another adverse effect on device performance characteristics. When an interlayer film is formed between the light-emitting film and the hole transporting layer, the uniformity of the interlayer may be difficult to achieve, and may also present additional challenges to form a light-emitting film on the interlayer.

In the light-emitting device according to an embodiment, the quantum dots in a light-emitting film may have additional passivation provided by a fluorine containing organic salt compound (e.g., the salt compound itself or a residue thereof that may be formed therein), even when substantially no interlayer is present between the light emitting layer and the adjacent structure layer (e.g., a common layer(s) such as the HTL and/or the ETL). The device of an embodiment may exhibit improved properties, e.g., improved luminescent properties, extended life-span, (thermal) stability, or the like.

Accordingly, in a device of an embodiment, the light-emitting film includes a plurality of quantum dots and a fluorine-containing organic salt (e.g., the salt compound itself or a residue thereof that may be formed therein). The quantum dots may form (e.g., constitute) at least a portion of the surface of the light-emitting film. The light-emitting film may exhibit increased hole transport capability. The light-emitting film may exhibit improved thermal stability.

In an embodiment, the quantum dots may have a core shell structure. The quantum dots may include a core including a first semiconductor nanocrystal and a shell disposed on the core. The shell includes a second semiconductor nanocrystal having a composition different from that of the first semiconductor nanocrystal.

The quantum dot (e.g., first semiconductor nanocrystal and/or the second semiconductor nanocrystal) may include a Group II-VI compound, a Group III-V compound, a Group IV-VI compound, a Group IV element or compound, a Group I-III-VI compound, a Group I-II-IV-VI compound, or a combination thereof. The light-emitting film (or quantum dots, first semiconductor nanocrystals, or second semiconductor nanocrystals) may not include harmful heavy metals such as cadmium, lead, mercury, or a combination thereof.

The Group II-VI compound may include a binary element compound including ZnS, ZnSe, ZnTe, ZnO, HgS, HgSe, HgTe, MgSe, MgS, or a mixture thereof; a ternary element compound including ZnSeS, ZnSeTe, ZnSTe, HgSeS, HgSeTe, HgSTe, HgZnS, HgZnSe, HgZnTe, MgZnSe, MgZnS, or a mixture thereof; or a quaternary element compound including HgZnTeS, HgZnSeS, HgZnSeTe, HgZnSTe, or a mixture thereof. The Group II-VI compound may further include a Group III metal.

The Group III-V compound may include a binary element compound including GaN, GaP, GaAs, GaSb, AlN, AlP, AlAs, AlSb, InN, InP, InAs, InSb, or a mixture thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, or mixture thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The Group III-V compound may further include a Group II element. Examples of such a semiconductor nanocrystal may be InZnP.

The Group IV-VI compound may include a binary element compound including SnS, SnSe, SnTe, or a mixture thereof; a ternary element compound including SnSeS, SnSeTe, SnSTe, or a mixture thereof; or a quaternary element compound including SnSSeTe.

Examples of the Group compound may include $CuInSe_2$, $CuInS_2$, CuInGaSe, or CuInGaS but are not limited thereto.

Examples of the Group I-II-IV-VI compound may include CuZnSnSe or CuZnSnS but are not limited thereto.

The Group IV element or compound may include a single-element including Si, Ge, or a combination thereof; or a binary element compound including SiC, SiGe, or a mixture thereof.

In an embodiment, the first semiconductor nanocrystal may include a metal including indium, zinc, or a combination thereof and a non-metal including to phosphorus, selenium, tellurium, sulfur, or a combination thereof. In an embodiment, the second semiconductor nanocrystal may include a metal including indium, zinc, or a combination thereof and a non-metal including phosphorus, selenium, tellurium, sulfur, or a combination thereof.

In an embodiment, the first semiconductor nanocrystal may include InP, InZnP, ZnSe, ZnSeS, ZnSeTe, or a combination thereof and/or the second semiconductor nanocrystal may include ZnSe, ZnSeS, ZnS, ZnTeSe, or a combination thereof. In an embodiment, the shell may include zinc, sulfur, and optionally selenium in the outermost layer.

In an embodiment, the quantum dots may emit blue light or green light and have a core including ZnSeTe, ZnSe, or a combination thereof and a shell including zinc chalcogenide (e.g., ZnS, ZnSe, and/or ZnSeS). In the shell, an amount of sulfur may increase or decrease in a radial direction (from the core toward the surface).

In an embodiment, the quantum dots emit red light or green light, and the core may include InP, InZnP, or a combination thereof. Moreover, the shell may include Group II a metal including zinc and a non-metal including at least one of sulfur and selenium.

In an embodiment, if the quantum dots have a core shell structure, an alloyed interlayer may be present or may not be present at or near the interface between the core and the shell. The alloyed layer may include a homogeneous alloy, a compositional concentration gradient alloy, or a combination thereof. The gradient alloy may have a concentration gradient wherein the concentration of an element of the shell radially changes (e.g., decreases or increases toward the core).

In an embodiment, the shell may have a composition that changes in a radial direction. In an embodiment, the shell may be a multi-layered shell including two or more layers. In the multi-layered shell, adjacent two layers may have different compositions from each other. In the multi-layered shell, at least one layer may independently include a semiconductor nanocrystal having a single composition. In the multi-layered shell, at least one layer may independently have an alloyed semiconductor nanocrystal. In the multi-layered shell, at least one layer may have a concentration gradient that radially changes in terms of a composition of a semiconductor nanocrystal.

In the core shell quantum dot, the materials of the shell may have a bandgap energy that is larger than that of the core, but it is not limited thereto. The materials of the shell may have a bandgap energy that is smaller than that of the core, but it is not limited thereto. In the case of the multi-layered shell, the energy bandgap of an outermost layer material of the shell may be greater than that of the core and an inner layer material of the shell (layers that are closer to the core). In the case of the multi-layered shell, a semiconductor nanocrystal of each layer is selected to have an appropriate bandgap, thereby effectively showing a quantum confinement effect.

The quantum dots of an embodiment may include an organic ligand, for example, bound or coordinated on the surface.

The organic ligand may include RCOOH, $RNH_2$, $R_2NH$, $R_3N$, RSH, $R_3PO$, $R_3P$, ROH, RCOOR, $RPO(OH)_2$, RHPOOH, RHPOOH, or a combination thereof. Herein, each R is independently a substituted or unsubstituted C3 to C40 aliphatic hydrocarbon group (e.g., alkyl, alkenyl, alkynyl, etc.), a substituted or unsubstituted C6 to C40 aromatic hydrocarbon group (an aryl group), or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; amines such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, myristic acid, stearic acid, lauric acid, or benzoic acid; a phosphine compound such as methyl phosphine, ethyl phosphine, propyl phosphine, butyl phosphine, pentyl phosphine, octylphosphine, dioctyl phosphine, tributylphosphine, or trioctylphosphine; a phosphine compound or an oxide compound thereof such as methyl phosphine oxide, ethyl phosphine oxide, propyl phosphine oxide, butyl phosphine oxide, pentyl phosphineoxide, tributylphosphine oxide, octylphosphine oxide, dioctyl phosphine oxide, or trioctylphosphine oxide; diphenyl phosphine, triphenyl phosphine compound or an oxide compound thereof; C5 to C20 alkyl phosphinic acid or C5 to C20 alkyl phosphonic acid such as hexylphosphinic acid, octylphosphinic acid, dodecanephosphinic acid, tetradecanephosphinic acid, hexadecanephosphinic acid, or octadecanephosphinic acid; and the like, but are not limited thereto.

The absorption/emission wavelength of a quantum dot may be adjusted by adjusting the composition and/or size of the quantum dot. A maximum emission peak wavelength of the quantum dot may have a wavelength in a range of ultraviolet to infrared wavelengths or higher. For example, the maximum emission peak wavelength of the quantum dot may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum emission peak wavelength of the quantum dot may be less than or equal to about 800 nm, for example, be less than or equal to about 700 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum emission wavelength of the quantum dots may be in the range of about 500 nm to about 650 nm.

The quantum dots may emit green light and the maximum emission wavelength may be in the range of greater than or equal to about 500 nm (e.g., greater than or equal to about 510 nm) and less than or equal to about 560 nm (e.g., less than or equal to about 540 nm). The quantum dots may emit red light and the maximum emission wavelength may be in the range of greater than or equal to about 600 nm (e.g., greater than or equal to about 610 nm) and less than or equal to about 650 nm (e.g., less than or equal to about 640 nm). The quantum dots may emit blue light and the maximum emission wavelength may be in the range of greater than or equal to about 440 nm (e.g., greater than or equal to about 450 nm) and less than or equal to about 480 nm (e.g., less than or equal to about 465 nm).

The quantum dots may exhibit a photoluminescence spectrum having a relatively narrow full width at half maximum (FWHM). In an embodiment, the quantum dots may have a full width at half maximum (FWHM) of about less than or equal to about 45 nm, for example less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm, in a photoluminescence spectrum.

The quantum dots may have (e.g., may be configured to realize) a quantum yield of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%.

The quantum dots may have a size (e.g., an average size) (for example, a particle diameter or in the case of non-spherically shaped particle, a particle diameter calculated from a two-dimensional area confirmed by an electron microscopy analysis) of greater than or equal to about 1 nm and less than or equal to about 100 nm. In an embodiment, the quantum dots may have a size (e.g., an average size) of about 1 nm to about 50 nm, for example, about 2 nm (or about 3 nm) to about 35 nm. In an embodiment, the quantum dots may have an average size of greater than or equal to about 1 nm, greater than or equal to about 2 nm, greater than or equal to about 3 nm, greater than or equal to about 4 nm, or greater than or equal to about 5 nm. In an embodiment, the quantum dots may have a size (e.g., an average size) of less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm.

The quantum dots may have any shape. In an embodiment, the shapes of the quantum dots may include a sphere, a polyhedron, a pyramid, a multi-pod, a cubic, a nanotube, a nanowire, a nanofiber, a nanosheet, a nanoplate, or a combination thereof.

The quantum dots may be synthesized by any method. For example, several nano-sized semiconductor nanocrystals (e.g., the quantum dot) may be synthesized through a wet chemical process. In the wet chemical process, nanocrystal particles (e.g., the quantum dot) are grown by reacting precursor materials in an organic solvent, and growth of the nanocrystals may be controlled by coordinating the organic solvent or ligand compound on the surface of the semiconductor nanocrystals. The semiconductor nanocrystals may be recovered through a process of pouring the quantum dot product mixture into an excess of non-solvent to remove excess organic materials not coordinated to the surface and centrifuging the obtained mixture to separate the quantum dots. Specific examples of the non-solvent may include acetone, ethanol, and methanol, but are not limited thereto.

The fluorine-containing organic salt (or a residue thereof) that is included in the light-emitting film may contribute to improvement of performance/life-span of the device. The fluorine-containing organic salt (or a residue thereof) may be bound to (or on the surface of) the quantum dots. Colloidally synthesized quantum dots have a ligand having an aliphatic chain on the surface, which is for dispersibility and the like, but acts as an insulator in the device. In addition, the present inventors have found that it may be difficult for a fluorine inorganic salt-based compound (e.g., $ZnF_2$) or the like to accomplish (or to exhibit or provide) a desired level of solubility. In addition, the present inventors have found that a fluoride anion including boron or phosphorus (e.g., $BF_4^-$, $PF_6^-$) with a metal moiety may not provide quantum dots with substantial passivation and may result in only a very limited-level of life-span improvement (or substantially no improvement of lifespan).

The present inventors have also found that a Nitrosyl $BF_4$ or an (inorganic) acid having a fluoride anion (e.g., $HBF_4$) may result in a substantial damage on a thin film and/or may cause a significant decrease in a photoluminescent quantum efficiency (PL QY) of the quantum dot.

By contrast, in a device of an embodiment, the fluorine-containing organic salt may provide passivation for example by reacting with a surface of a quantum dot to passivate the surface of the quantum dot (for example, even with a relatively simple process). Without wishing to be bound by any theory, it is believed that the fluorine-containing organic salt may provide a desired (e.g., a necessary or relatively high) degree of reactivity for surface exchange of a quantum dot, while the surface exchange may not cause (e.g., generate) an additional defect level in the quantum dots.

The fluorine-containing organic salt includes a substituted or unsubstituted C1 to C30 hydrocarbon group, a non-metallic element (e.g., capable of forming an onium salt), fluorine, and at least one of boron or phosphorus (e.g., B, P, or a combination thereof). The non-metallic element for example capable of forming the onium salt includes carbon, nitrogen, oxygen, phosphorus, sulfur, selenium, or a combination thereof.

The substituted or unsubstituted C1 to C30 hydrocarbon group may be aliphatic hydrocarbon group (alkyl, alkenyl, or alkynyl) of C1 or more, C5 or more, C10 or more, or C15 or more and C30 or less, C25 or less, C20 or less, C15 or less, C10 or less, or C5 or less. The substituted or unsubstituted C1 to C30 hydrocarbon group may be a C6 to C30 aromatic hydrocarbon group, for example, a phenyl group or a naphthyl group. The substituted or unsubstituted C1 to C30 hydrocarbon group may be a C3 to C30 alicyclic hydrocarbon group, for example, a cyclohexyl group. The carbon number of the hydrocarbon group may be 2 or more, 3 or more, 4 or more, 5 or more, or 6 or more. The carbon number of the hydrocarbon group may be 30 or less, 25 or less, 20 or less, 15 or less, 10 or less, or 5 or less. The hydrocarbon group may be an alkyl group, an alkenyl group, an alkynyl group, an aryl group, e.g., a naphthyl group, a heteroaryl group, an alicyclic group, or a combination thereof.

In an embodiment, the fluorine-containing organic salt (or anion thereof) may include fluoroborate, fluorophosphate, or a combination thereof. The anion of the fluorine-containing organic salt may be tetrafluoroborate, hexafluorophosphate, or a combination thereof. The fluorine-containing organic salt may have the form of an onium salt. For example, the fluorine-containing organic salt may include a carbonium moiety, an oxonium moiety, an ammonium moiety, a phosphonium moiety, or a combination thereof.

The fluorine-containing organic salt may be $(R)_x A^+ B^-$ wherein R is a substituted or unsubstituted C1 to C30 aliphatic or aromatic hydrocarbon group, A is C, N, O, P, S, or Se, x is an integer of 1 or more that is determined according to a valence of A, and B may be represented by $BF_4^-$ or $PF_6^-$.

In an embodiment, the fluorine-containing organic salt may be a salt including $R_5C^+$, $R_4N^+$, $R_3O^+$, $R_3S^+$, $R_3Se^+$, or $R_4P^+$, wherein R is the same or different and is a substituted or unsubstituted C1 to C30 (or C10) aliphatic hydrocarbon group (e.g., alkyl, alkenyl, alkynyl), a substituted or unsubstituted C6 to C20 aromatic hydrocarbon group, a substituted or unsubstituted C3 to C30 alicyclic hydrocarbon group, or a combination thereof. The fluorine-containing organic salt may include a trialkyloxonium tetrafluoroborate (e.g., trimethyloxonium tetrafluoroborate), a tetraalkylammonium tetrafluoroborate (e.g., tetraethylammonium tetrafluoroborate), a trialkyloxonium hexafluorophosphate (e.g., triethyloxonium hexafluorophosphate), or a combination thereof.

The amount of the quantum dots and the amount of the fluorine-containing organic salt in the thin film may be adjusted so that the light-emitting film may exhibit a desired composition. The composition of the light-emitting film may be confirmed by an appropriate means (e.g., a electron microscope-based energy dispersive spectroscopy such as a TEM-EDX or a SEM EDX).

In an embodiment, the light-emitting film may include boron, and a mole ratio of boron relative to carbon may be greater than or equal to about 0.001:1, greater than or equal to about 0.005:1, greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, greater than or equal to about 0.9:1, or greater than or equal to about 1:1. The mole ratio of boron relative to carbon may be less than or equal to about 0.6:1, less than or equal to about 0.5:1, or less than or equal to about 0.4:1, for example, as determined by energy dispersive spectroscopy of the light-emitting film.

In an embodiment, the light-emitting film may include phosphorus, and a mole ratio of phosphorus relative to carbon may be greater than or equal to about 0.001:1, greater than or equal to about 0.005:1, greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, greater than or equal to about 0.9:1, or greater than or equal to about 1:1. The mole ratio of phosphorus relative to carbon may be less than or equal to about 0.6:1, less than or equal to about 0.5:1, or less than or equal to about 0.4:1, for example, as determined by energy dispersive spectroscopy of the light-emitting film.

In the light-emitting film of an embodiment that includes boron, a mole ratio of fluorine relative to boron may be greater than or equal to about 4:1, or about 4.5:1. In the light-emitting film of an embodiment, the mole ratio of fluorine relative to boron may be less than or equal to about 6:1, about less than or equal to 5.5:1, or less than or equal to about 5:1. The mole ratio of the fluorine relative to boron may be determined by energy dispersive spectroscopy of the light-emitting film.

The quantum dots may include zinc and a chalcogen element (e.g., sulfur, selenium, or sulfur and selenium), and a mole ratio of carbon relative to a total moles of the zinc and the chalcogen element (e.g., sulfur, selenium, or sulfur and selenium) may be less than or equal to about 10:1, less than or equal to about 9:1, less than or equal to about 8:1, less than or equal to about 7:1, less than or equal to about 6:1, or less than or equal to about 5:1. The mole ratio of carbon relative to the total moles of the zinc and chalcogen element (e.g., sulfur, selenium, or sulfur and selenium) may be greater than or equal to about 1:1, greater than or equal to about 2:1, greater than or equal to about 3:1, greater than or equal to about 4:1, or greater than or equal to about 5:1, for example, as determined by energy dispersive spectroscopy of the light-emitting film.

In an embodiment, in the light-emitting film, a mole ratio of carbon relative to metal (e.g., zinc) included in the quantum dots may be greater than or equal to about 1:1, greater than or equal to about 2:1, greater than or equal to about 3:1, greater than or equal to about 4:1, greater than or equal to about 5:1, greater than or equal to about 6:1, greater than or equal to about 7:1, or greater than or equal to about 8:1. The mole ratio of carbon relative to metal (e.g., zinc) included in the quantum dots may be less than or equal to about 20:1, less than or equal to about 15:1, less than or equal to about 10:1, less than or equal to about 9:1, less than or equal to about 8:1, less than or equal to about 7:1, less than or equal to about 6:1, less than or equal to about 5:1, or less than or equal to about 4:1, for example, as determined by energy dispersive spectroscopy of the light-emitting film.

The light-emitting film may have a thickness of greater than or equal to about 5 nanometers (nm), for example, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 21 nm, greater than or equal to about 22 nm, greater than or equal to about 23 nm, greater than or equal to about 24 nm, greater than or equal to about 25 nm, greater than or equal to about 30 nm, or greater than or equal to about 35 nm. The light-emitting film may include two or to more monolayers of quantum dots. The light-emitting film may have a thickness of less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, less than or equal to about 30 nm, or less than or equal to about 25 nm.

In an embodiment, at least a portion of the surface of the light-emitting film (or the surface of the light-emitting film) may not include a thiol compound (for example, the thiol compound bound to the plurality of quantum dots). The thiol compound may be a mono thiol compound, a cis-type dithiol compound, or a combination thereof.

The plurality of quantum dots may further include a carboxylic acid compound on a surface thereof. The carboxylic acid compound may be an organic ligand originally present on the surface of quantum dots. The carboxylic acid compound may include a C6 to C30 aliphatic carboxylic acid compound. The carboxylic acid compound may include a ligand derived from a compound represented by RCOOH (wherein R is a C12 or higher alkyl group or a C12 or higher alkenyl group) in a limited amount.

The light-emitting film may be disposed on the substrate. The substrate may include an electrode, a hole auxiliary layer (e.g., a hole injecting layer, a hole transporting layer, or a combination thereof), an electron auxiliary layer, or a combination thereof in the light-emitting device. The substrate may be a light-transmitting or transparent substrate.

The light-emitting film may exhibit an absolute value of an (e.g., HOMO and/or LUMO) energy level that is increased by adopting the aforementioned configuration and/or the composition of the light-emitting film for example in comparison with an light emitting film without the fluorine containing organic salt of an embodiment. Accordingly, the energy level as adjusted thereby may lower a barrier to a charge flow (e.g., an electron flow) from an adjacent charge auxiliary layer (e.g., electron transporting layer) to the light-emitting layer in the light-emitting device.

In an embodiment, the HOMO energy level of the light-emitting film of an embodiment may be greater than or equal to about 5.7 eV, greater than or equal to about 5.75 eV, greater than or equal to about 5.8 eV, greater than or equal to about 5.85 eV, greater than or equal to about 5.9 eV, greater than or equal to about 5.95 eV, greater than or equal to about 6 eV, greater than or equal to about 6.05 eV, or greater than or equal to about 6.1 eV.

The light-emitting film may emit light of a desired wavelength. A wavelength (or a center wavelength, hereinafter, referred to as a wavelength) of (a maximum luminescent peak of) the emitted light may be in a range of greater than or equal to about 430 nm, greater than or equal to about 440 nm, greater than or equal to about 450 nm, greater than or equal to about 460 nm, greater than or equal to about 470 nm, greater than or equal to about 480 nm, greater than or equal to about 490 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, greater than or equal to about 610 nm, greater than or equal to about 620 nm, greater than or equal to about 630 nm, greater than or equal to about 640 nm, or greater than or equal to about 650 nm. The wavelength of the emitted light may be in a range of less than or equal to about 750 nm, less than or equal to about 740 nm, less than or equal to about 730 nm, less than or equal to about 720 nm, less than or equal to about 710 nm, less than or equal to about 700 nm, less than or equal to about 690 nm, less than or equal to about 680 nm, less than or equal to about 670 nm, less than or equal to about 660 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, less than or equal to about 540 nm, less than or equal to about 530 nm, less than or equal to about 520 nm, less than or equal to about 510 nm, less than or equal to about 500 nm, less than or equal to about 490 nm, less than or equal to about 480 nm, less than or equal to about 470 nm, or less than or equal to about 460 nm. The emitted light may be red light, green light, blue light, or amber (or orange) light.

A wavelength of the red light may be in a range of greater than or equal to about 590 nm, greater than or equal to about 600 nm, greater than or equal to about 610 nm, greater than or equal to about 620 nm, greater than or equal to about 630 nm, greater than or equal to about 640 nm, or greater than or equal to about 650 nm. The wavelength of the red light may be in a range of less than or equal to about 750 nm, less than or equal to about 740 nm, less than or equal to about 730 nm, less than or equal to about 720 nm, or less than or equal to about 710 nm.

A wavelength of the green light may be in a range of greater than about 490 nm, greater than or equal to about 495 nm, greater than or equal to about 500 nm, greater than or equal to about 510 nm, greater than or equal to about 520 nm, greater than or equal to about 530 nm, greater than or equal to about 540 nm, or greater than or equal to about 550 nm. The wavelength of the green light may be in a range of less than or equal to about 560 nm, less than or equal to about 550 nm, less than or equal to about 540 nm, or less than or equal to about 530 nm.

A wavelength of the blue light may be in a range of greater than or equal to about 400 nm, greater than or equal to about 410 nm, greater than or equal to about 420 nm, greater than or equal to about 430 nm, greater than or equal to about 440 nm, greater than or equal to about 450 nm, or greater than or equal to about 460 nm. The wavelength of the blue light may be in a range of less than or equal to 490 nm, less than or equal to about 480 nm, less than or equal to about 470 nm, less than or equal to about 460 nm, or less than or equal to about 450 nm.

In an embodiment, if emitting red light, the HOMO energy level of the light-emitting film may be greater than or equal to about 5.7 eV, greater than or equal to about 5.8 eV, or greater than or equal to about 5.9 eV.

In an embodiment, if the light-emitting film emits green light, the HOMO energy level of the light-emitting film may be greater than or equal to about 5.7 eV, greater than or equal to about 5.8 eV, or greater than or equal to about 5.9 eV.

In an embodiment, if the light-emitting film emits blue light, the HOMO energy level of the light-emitting film may be greater than or equal to about 5.9 eV, or greater than or equal to about 6.0 eV.

An absolute value of the difference between the LUMO and HOMO energy levels of the light-emitting film, or between the LUMO energy level ($E_{LUMO}$) of the quantum dots and the conduction band edge energy ($E_{conduction\ band\ edge}$) of a material capable of transporting and injecting electrons may be greater than or equal to about 0.5 eV, for example, greater than or equal to about 0.6 eV, and/or less than about 1.5 eV, for example, less than or equal to about 1 eV.

Referring to FIG. 2, the device of an embodiment may further include a hole auxiliary layer 12 between the anode 11 (e.g., the first electrode) and the light-emitting film 13. The hole auxiliary layer 12 may be one or two or more layers, and may include, for example, a hole injecting layer, a hole transporting layer, and/or an electron blocking layer (not shown).

The hole auxiliary layer 12 may have a HOMO energy level that may be matched with the HOMO energy level of the light-emitting film 13, and as a result, mobility of the holes transferred from the hole auxiliary layer 12 to the light-emitting film 13 may be facilitated.

A HOMO energy level of the hole auxiliary layer (for example, the hole transporting layer) 12 adjacent to the light-emitting film may be appropriately adjusted in consideration of the HOMO energy level of the light-emitting film 13. In an embodiment, the hole auxiliary layer 12 may include a hole injecting layer disposed close to the first electrode 11 and a hole transporting layer disposed close to the light-emitting film 13.

The material included in the hole auxiliary layer 12 is not particularly limited. In an embodiment, the hole auxiliary layer may exhibit relatively high hole conductivity. A material of the hole auxiliary layer may include an organic monomolecular compound, a polymer compound, or a combination thereof. For example, the material of the hole auxiliary layer may include at least one of poly(9,9-dioctyl-fluorene-co-N-(4-butylphenyl)-diphenylamine) (TFB), polyarylamine, poly(N-vinylcarbazole) (PVK), poly(3,4-ethylenedioxythiophene) (PEDOT), poly(3,4-ethylenedioxythiophene)polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), 4,4',4"-Tris[phenyl(m-tolyl)amino]triphenylamine (m-MTDATA), 4,4',4"-tris(N-carbazolyl)-triphenylamine (TCTA), 1,1-bis[(di-4-tolylamino)phenyl]cyclohexane (TAPC), p-type metal oxide (e.g., NiO, WO$_3$, MoO$_3$, etc.), a carbon-based material such as graphene oxide, or a combination thereof, but is not limited thereto.

For example, the hole auxiliary layer (e.g., hole transporting layer, hole injecting layer, or a combination thereof) may have a thickness of greater than or equal to about 1 nm, greater than or equal to about 5 nm, greater than or equal to about 10 nm, greater than or equal to about 15 nm, greater than or equal to about 20 nm, or greater than or equal to about 25 nm and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto.

The hole injecting layer and/or the hole transporting layer may be formed by a solution process (e.g., spin coating, etc.). The hole injecting layer and/or the hole transporting layer may be formed by a deposition process.

Referring to FIG. 2, the electron auxiliary layer 14 is disposed between the light-emitting layer 13 and the second electrode 15. The electron auxiliary layer 14 may include, for example, an electron injecting layer, an electron transporting layer, and/or a hole (or electron) blocking layer. The electron auxiliary layer may be, for example, an electron injecting layer (EIL) that facilitates electron injection, an electron transporting layer (ETL) that facilitates electron transport, or a hole blocking layer (HBL) that blocks hole movement, or a combination of thereof. For example, an electron injecting layer may be disposed between the electron transport layer and the cathode. For example, a hole blocking layer may be disposed between the light-emitting layer and the electron transporting (injecting) layer, but is not limited thereto. The thickness of each layer may be appropriately selected. For example, the thickness of each layer may be greater than or equal to about 1 nm and less than or equal to about 500 nm, but is not limited thereto. The electron injecting layer may be an organic layer formed by deposition. The electron transporting layer may include inorganic oxide nanoparticles or be an organic layer formed by deposition. The electron transporting layer (ETL) may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-(4-(4, 6-di(naphthalen-2-yl)-1,3,5-triazin-2-yl)phenyl)quinolone), 8-hydroxyquinolinato lithium (Liq), n-type metal oxide (e.g., ZnO, HfO$_2$, etc.), or a combination thereof, but is not limited thereto.

The electronic auxiliary layer 14 may include a plurality of metal oxide nanoparticles. The nanoparticles may include a metal oxide including zinc. The metal oxide may include a zinc oxide, a zinc magnesium oxide, or a combination thereof. The metal oxide may include $Zn_{1-x}M_xO$ (wherein, M is Mg, Ca, Zr, W, Li, Ti, Y, Al, or a combination thereof and 0≤x≤0.5). In an embodiment, in Chemical Formula 1, M may be magnesium (Mg). In an embodiment, in Chemical Formula 1, x may be greater than or equal to about 0.01 and less than or equal to about 0.3, for example, less than or equal to about 0.25, less than or equal to about 0.2, or less than or equal to about 0.15.

In an embodiment, an absolute value of LUMO of the aforementioned quantum dots included in the light-emitting layer may be smaller than the absolute value of LUMO of the metal oxide. The nanoparticles may have an average size of greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not be rod-shaped. The nanoparticles may not be nanowire-shaped.

The hole blocking layer (HBL) may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, or a combination thereof, but is not limited thereto.

In an embodiment, each thickness of the electron auxiliary layer 14 (e.g., an electron injecting layer, an electron transporting layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 3:
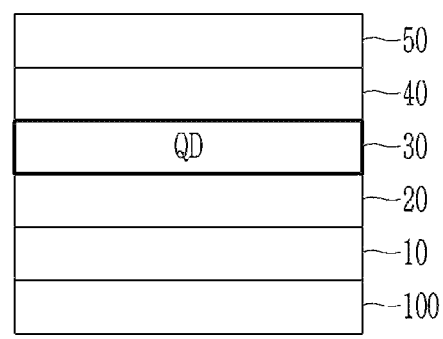
FIG. 3 is a cross-sectional representation of a light-emitting device according to a non-limiting embodiment.

A device according to an embodiment may have a normal structure. In an embodiment, referring to FIG. 3, the device includes an anode 10 disposed on a transparent substrate 100, e.g., a metal oxide-based transparent electrode (e.g., ITO electrode) and, a cathode 50 (e.g., facing the anode) may include a conductive metal (Mg, Al, etc.) (e.g., having a relatively low work function). A hole auxiliary layer 20 (e.g., a hole injecting layer of PEDOT:PSS and/or p-type metal oxide, and the like and/or hole transport layer of TFB and/or PVK) may be disposed between the transparent electrode 10 and the light-emitting layer 30. The hole injecting layer may be proximate to the transparent electrode and the hole transport layer may be proximate to the light-emitting layer. An electron auxiliary layer 40 such as an electron injecting layer/transporting layer may be disposed between the quantum dot light-emitting layer 30 and the cathode 50.

Figure 4:
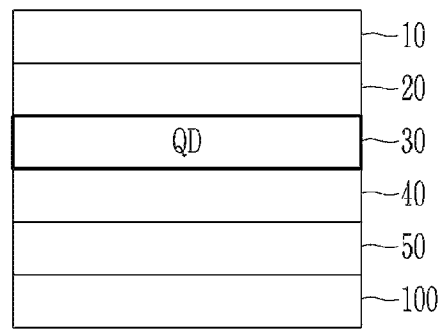
FIG. 4 is a schematic cross-sectional representation of a light-emitting device according to another non-limiting embodiment.

In an embodiment, a device according to another embodiment may have an inverted structure. For example, referring to FIG. 4, a cathode 50 is disposed on a transparent substrate 100, e.g., a metal oxide-based transparent electrode (e.g., ITO) and, an anode 10 may include a metal (Au, Ag, etc.) (e.g., having a relatively high work function). For example, (optionally doped) n-type metal oxide (crystalline Zn metal oxide) may be disposed between the transparent electrode 50 and the light-emitting layer 30 as an electron auxiliary layer 40 (e.g., an electron transporting layer). MoO$_3$ or other p-type metal oxides may be disposed between the metal anode 10 and the quantum dot light-emitting layer 30 as a hole auxiliary layer 20 (e.g., a hole transport layer including TFB and/or PVK and/or a hole injecting layer including MoO$_3$ or other p-type metal oxides).

In an embodiment, the light-emitting device may have a maximum luminance of greater than or equal to about 10,000 cd/m$^2$, greater than or equal to about 15,000 cd/m$^2$, greater than or equal to about 18,000 cd/m$^2$, or greater than or equal to about 20,000 cd/m$^2$. In an embodiment, T50 of the devices may be greater than or equal to about 10 hours (hr), greater than or equal to about 15 hr, greater than or equal to about 20 hr, greater than or equal to about 25 hr, greater than or equal to about 30 hr, greater than or equal to about 35 hr, greater than or equal to about 40 hr, greater than or equal to about 45 hr, or greater than or equal to about 50 hr.

The devices according to an embodiment may have a maximum external quantum efficiency (EQE) of greater than or equal to about 7%, for example, greater than or equal to about 7.5%, greater than or equal to about 7.7%. In an embodiment, T95 of the devices may be greater than or equal to about 6 hr, greater than or equal to about 25 hr, greater than or equal to about 30 hr, greater than or equal to about 35 hr, greater than or equal to about 40 hr, greater than or equal to about 45 hr, or greater than or equal to about 50 hr.

The devices of an embodiment may emit blue light. The blue light may have a maximum emission peak wavelength of greater than or equal to about 445 nm, greater than or equal to about 448 nm, or greater than or equal to about 450 nm and less than or equal to about 460 nm, less than or equal to about 458 nm, or less than or equal to about 455 nm. An emission peak of the blue light may have a full width at half maximum (FWHM) of less than or equal to about 21 nm, for example, less than or equal to about 20 nm, less than or equal to about 19 nm, less than or equal to about 18 nm, or less than or equal to about 17 nm.

The light-emitting film may have a hole transport capability measured at a predetermined voltage (e.g., at about 8 Volts) of greater than or equal to about 300 milliampere per square centimeter (mA/cm$^2$), greater than or equal to about 400 mA/cm$^2$, greater than or equal to about 450 mA/cm$^2$, or greater than or equal to about 500 mA/cm$^2$.

The hole transport capability may be measured using a hole only device. In an embodiment, the HOD may have a layered structure of an anode (e.g., ITO)/a HIL such as a PEDOT:PSS layer/an HTL such as a TFB layer/a QD light-emitting layer/a HTL such as an organic HTL/an HIL such as a HAT-CN layer/an anode such as Ag). The thickness of each layer may be selected appropriately, for example, as recited herein. The quantum dot emission layer may have a thickness of 15 to 40 nm. As an upper hole transport layer, an organic HTL/HAT-CN(dipyrazino[2,3-f:2',3'-h]quinoxaline-2,3,6,7,10,11-hexacarbonitrile) layers may be sequentially thermally deposited to have each thickness of 35 to 40 nm and 10 to 15 nm, respectively. The organic HTL may include a compound having a bi-carbazole moiety and a bi-phenyl moiety. A current depending upon a voltage may be measured by an appropriate source meter (e.g., Keithley 2635B source meter) while applying a voltage to the obtained HOD, and a hole transport capability may be evaluated.

In another embodiment, a method of producing the aforementioned light-emitting device includes providing a first electrode and a second electrode, and forming a light-emitting film between the first electrode and the second electrode. The method may include providing a first electrode; forming a light-emitting film on the first electrode; and providing a second electrode on the light-emitting film. In the embodiments. The forming of the light-emitting film includes providing a quantum dot layer including a plurality of quantum dots; and treating the quantum dot layer with a solution including a fluorine-containing organic salt in a polar solvent.

The method may further include forming a charge auxiliary layer (e.g., a hole injecting layer or a hole transporting layer) on the first electrode (e.g., an anode) before forming the light-emitting film. The method may further include forming a charge auxiliary layer (e.g., an electron transporting layer or an electron injecting layer) on the light-emitting film before forming the second electrode.

Details for the first electrode, second electrode, light-emitting film, quantum dot, fluorine-containing organic salt, and charge auxiliary layer are the same as described above.

It is appropriately selected considering a kind of the forming material, a thickness of the electrode/layer to be fabricated, and the like. The forming method may include a solution (wet) process, a deposition, or a combination thereof. For example, the hole auxiliary layer 12, the light-emitting film 13, and the electron auxiliary layer 14 may be obtained by, for example, a solution process. The solution process may include, for example, a spin coating, a slit coating, an inkjet printing, a nozzle printing, a spraying, and/or a doctor blade coating, but is not limited thereto.

In an embodiment, when the electron auxiliary layer includes an inorganic material, the electron auxiliary layer may be formed by performing a wet process. In an embodiment, the wet process may include a sol-gel method. In an embodiment, the wet process may include coating a dispersion in which nanoparticles are dispersed in a polar solvent on the quantum dot light-emitting film (e.g., by a spin coating, etc.); and drying and annealing the same. The polar solvent may include a C1 to C10 alcohol solvent such as ethanol, a C2 to C20 sulfoxide solvent such as dimethylsulfoxide, a C2 to C20 amide solvent such as dimethyl formamide, or a combination thereof, but is not limited thereto. The annealing may be performed at a predetermined temperature (e.g., a temperature of greater than or equal to about 60° C., or greater than or equal to about 70° C. and less than or equal to about 100° C., for example, less than or equal to about 90° C., less than or equal to about 80° C., or less than or equal to about 75° C.), for example, under vacuum, but is not limited thereto.

The forming of the quantum dot layer may be performed by obtaining or preparing a dispersion including quantum dots and applying or depositing it on the substrate or the charge auxiliary layer in an appropriate manner (e.g., spin coating, inkjet printing, etc.). The applied or deposited quantum dot layer may be heat-treated for drying. The heat-treating temperature is not particularly limited, and may be appropriately selected in consideration of a boiling point of the organic solvent used for preparing the dispersion. For example, the heat-treating temperature may be greater than or equal to about 60° C., for example, greater than or equal to about 70° C. The organic solvent for the dispersion including the quantum dots is not particularly limited and thus may be appropriately selected. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof.

The formed quantum dot layer is treated with a solution including the fluorine-containing organic salt in a polar solvent. The method may include washing the treated film one or more times (e.g., at least once or at least twice) with a polar solvent. The method may include heat-treating the washed film at a temperature of greater than or equal to about 60° C., for example greater than or equal to about 65° C., greater than or equal to about 70° C., greater than or equal to about 75° C., or greater than or equal to about 80° C. The treating of the quantum dot layer (for example with the solution including the fluorine-containing organic salt) may include contacting, coating, or applying.

An amount and/or a concentration of the solution of the fluorine-containing organic salt dissolved in the polar solvent may be selected in consideration of the desired composition of the light-emitting film. In an embodiment, the use amount of the fluorine-containing organic salt solution may be greater than or equal to about 100 milliliters (mL), greater than or equal to about 500 milliliters (mL), greater than or equal to about 1 Liter (L) and less than or equal to about 100 L, less than or equal to about 50 L, or less than or equal to about 40 L based on a square meter area (m$^2$) of the light-emitting film to be treated. The concentration of the fluorine-containing organic salt in the solution may be adjusted to be greater than or equal to about 0.1 grams per Liter (g/L) and less than or equal to about 200 g/L. Prior to the treatment of the quantum dot layer with the solution, the plurality of quantum dots may include a native ligand on a surface thereof. The native ligand may include the aforementioned carboxylic acid compound.

The polar solvent may include an organic solvent. The polar solvent may include an alcohol having a C1 to C10 linear or branched hydrocarbon group, a ketone solvent, an acetate solvent, a nitrile solvent, an amide solvent, a sulfoxide solvent, a pyridine solvent, or a combination thereof. For example, the polar solvent may include, for example, methanol, ethanol, propanol, isopropanol, butanol, pentanol, hexanol, heptanol, acetone, ethyl acetate, acetonitrile, DMF, DMAc, DMSO, NMP, or combinations thereof.

The treatment (e.g., the treatment of the quantum dot layer) may include contacting the solution with the quantum dot layer (film). The contacting may include spraying, immersing, adding in a dropwise fashion (drop), or a combination thereof, but is not limited thereto. The contacting may be performed together with stirring, heating, or a combination thereof. The treatment method includes spin coating, screen printing, blade printing, brush coating, but is not limited thereto.

The method may further include washing the treated film with a polar solvent for one or more times. During the washing step, at least a portion of the fluorine-containing organic salt which is not bound to the plurality of quantum dots may be removed. The method may further include heat-treating the washed film at a temperature of greater than or equal to about 60° C. and less than or equal to about 150° C.

Hereinafter, specific embodiments of the present invention are presented. However, the examples described below are only for specifically illustrating or explaining the invention, and thus the scope of the invention should not be limited.

Analysis Method

[1] Photoluminescence Analysis and UV Spectroscopy
  (1) Photoluminescence (PL) spectra of the produced quantum dot nanocrystals are obtained using a Hitachi F-7000 spectrophotometer at an irradiation wavelength of 380 nm.
  (2) UV spectroscopy is performed using a Hitachi U-3310 spectrophotometer to obtain a UV-Visible absorption spectrum.

[2] TEM and TEM-EDX Analysis
  (1) Transmission electron microscopic analysis is performed on the top surface or the cross-section of the produced device or structure using a UT F30 Tecnai electron microscope.
  (2) SEM-EDX analysis is performed on the top surface or the cross-section of the produced device or structure using SEM-Tecnai G2.

[3] HOMO and LUMO Levels Measurements
The measurements are made using a surface analyzer (Model AC-3, photoelectron spectrophotometer in Air) of Riken Keiki Co. Ltd in air or an UPS (UV absorption (Optical band-gap)).

[4] Electroluminescence Spectroscopy
Electroluminescent properties of the obtained quantum dot light-emitting device are evaluated using a Keithley 2200 source measuring device and a Minolta CS2000 spectroradiometer (a current-voltage-luminance measurement equipment). A current depending on a voltage applied to the devices, luminance, and electroluminescence (EL) are measured by using the current-voltage-luminance-measuring equipment, and the external quantum efficiency is calculated.

[5] Life-Span Characteristics
T50 (h): The time in hours (hr) the device takes to reach a luminance of 50% compared with an initial luminance when the device is driven with a predetermined luminance (e.g., 650 nit).

T95(h): The time in hours (hr) the device takes to reach a luminance of 95% compared with an initial luminance when the device is driven with a predetermined luminance (e.g., 650 nit).

[6] Evaluation of Hole Transport Capability

HOD (ITO/PEDOT:PSS/TFB/QD light-emitting layer/organic HTL 360 Å/HAT-CN 100 Å/Ag) is produced as follows. An ITO patterned substrate is surface-treated with ultraviolet (UV)-ozone (UVO). A PEDOT:PSS layer is spin-coated to be 30 nanometers (nm) thick, and then heat-treated to remove a residual organic material. As a hole transport layer (HTL), a TFB layer is spin-coated to be 25 nm thick, and then heat-treated to remove a residual organic material. A quantum dot dispersion is spin-coated to be 25 nm thick to form a light-emitting layer, and then heat-treated to remove a residual organic material. As an upper hole transport layer, an organic HTL/HAT-CN(dipyrazino[2,3-f:2',3'-h]quinoxaline-2,3,6,7,10,11-hexacarbonitrile) layers are sequentially thermally deposited to have each thickness of 36 nm and 10 nm, respectively. The organic HTL includes compounds having a bi-carbazole moiety and a bi-phenyl moiety. Under a mask, silver (Ag) is thermally deposited to form an electrode. A sealing resin/glass is used to seal the device.

A current depending upon a voltage is measured by a Keithley 2635B source meter while applying a voltage to the obtained HOD, and a hole transport capability is evaluated.

Reference Example 1: Preparation of Quantum Dots (BQD)

(1) Selenium (Se) and tellurium (Te) are dispersed (added in each) in trioctylphosphine (TOP) to provide a 2 molar (M) Se/TOP stock solution and a 0.1 M Te/TOP stock solution. 0.125 millimoles (mmol) of zinc acetate is combined with oleic acid (OA) into a reactor including trioctylamine and heated at 120° C. under vacuum. After 1 hour, nitrogen is added to the reactor.

After heating the reactor to 300° C., the prepared Se/TOP stock solution and Te/TOP stock solution are promptly injected into the reactor at a Te:Se mole ratio of 1:25. After completion of the reaction, acetone is added to the reaction solution, which is then rapidly cooled to a room temperature. The reaction mixture is centrifuged to provide a precipitate, and the precipitate is dispersed into toluene to provide ZnTeSe cores.

(2) 1.8 mmol (0.336 g) of zinc acetate is combined with oleic acid into a reaction flask including trioctylamine and heated under vacuum at 120° C. for 10 minutes. Nitrogen ($N_2$) is added to the reaction flask, which is then heated at 180° C. A ZnTeSe core obtained as above is added to the reaction flask, followed by injections of the Se/TOP and a S/TOP prepared by dispersing sulfur in trioctylphosphine at a concentration of 1 M. The reaction temperature is adjusted to about 280° C. After completion the reaction, the reaction flask is cooled, ethanol added, and the obtained nanocrystal is separated by centrifuge and dispersed in toluene to provide ZnTeSe/ZnSeS core shell quantum dots. It is confirmed that the obtained blue light emitting quantum dot (BQD) s have a first absorption peak wavelength of 410 nm, a PL wavelength of 453 nm, and a quantum yield (QY) of 85%.

Synthesis of Metal Oxide Nanoparticles

Reference Example 2: ZnMgO Synthesis

Zinc acetate dihydrate and magnesium acetate tetrahydrate are added to dimethylsulfoxide in a reactor to provide the following chemical formula below, and the reactor is heated at 60° C. in air. Subsequently, an ethanol solution of tetramethyl ammonium hydroxide pentahydrate is added in a dropwise fashion to the reactor at a rate of 3 milliliters per minute (mL/min). The obtained mixture is stirred for one hour, and the produced $Zn_{1-x}Mg_xO$ nanoparticles are separated with a centrifuge and dispersed in ethanol to obtain $Zn_xMg_{1-x}O$ nanoparticles, where x=0.15.

An X-ray diffraction analysis of the obtained nanoparticles confirm that ZnO crystals are formed. A transmission electron microscopic analysis of the obtained nanoparticles indicates that the particles have an average size of about 3 nm.

Production of Light-Emitting Film

Comparative Example 1

A BQD dispersion obtained from Reference Example 1 is spin-coated on a glass substrate to provide a film. The formed film is heat-treated at 80° C. for 30 minutes to provide a light-emitting film, OA (Oleic Acid).

Comparative Example 2-1

An ethanol solution of $Zn(BF_4)_2$ (concentration: 100 grams per Liter (g/L)) is added in a dropwise fashion on a film obtained by the same method as in Comparative Example 1 After 1 minute, the $Zn(BF_4)_2$ treated film is spun to remove the remaining solution, and the film is washed with ethanol. The washed film is heat-treated at 80° C. for 30 minutes to provide a light-emitting film.

Comparative Example 2-2

An ethanol solution of $ZnCl_2$ (concentration: 100 g/L) is added in a dropwise fashion on a film obtained by the same method as in Comparative Example 1. After 1 minute, the $ZnCl_2$-treated film is spun to remove the remaining solution, and the obtained film is washed by ethanol. The washed film is heat-treated at 80° C. for 30 minutes to provide a light-emitting film.

Example 1-1

An ethanol solution of trimethyloxonium tetrafluoroborate ($Me_3OBF_4$) (concentration: 100 g/L) is added in a dropwise fashion on a film obtained by the same method as in Comparative Example 1. After 1 minute, the $Me_3OBF_4$-treated film is spun to remove the remaining solution, and the obtained film is washed by ethanol. The washed film is heat-treated at 80° C. for 30 minutes to provide a light-emitting film.

Example 1-2

A light-emitting film is obtained in accordance with the same procedure as in Example 1-1, except that an ethanol solution (concentration: 5 g/L) of tetraethylammonium tetrafluoroborate ($Et_4NBF_4$) is used instead of the ethanol solution (100 g/L) of $Me_3OBF_4$.

Example 1-3

A light-emitting film is obtained in accordance with the same procedure as in Example 1-1, except that an ethanol solution (concentration: 100 g/L) of triethyloxonium hexafluorophosphate ($Et_3OPF_6$) is used instead of the ethanol solution (100 g/L) of $Me_3OBF_4$.

Experimental Example 1

Figure 5:
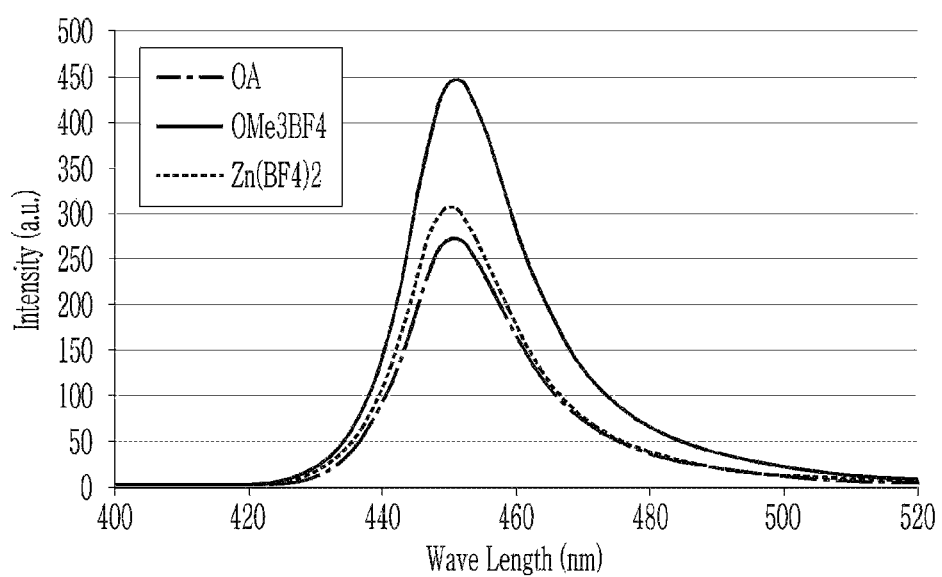
FIG. 5 shows photoluminescence spectra of the thin films prepared in Experimental Example 1.

Photoluminescence analyses of the films of Comparative Example 1 (denoted as OA), Comparative Example 2-1 (denoted as $Zn(BF_4)_2$), and Example 1-1 (denoted as $OMe_3BF_4$) are performed, and the PL spectra are shown in FIG. 5 together.

From the PL spectra of FIG. 5, it is confirmed that the light-emitting film of Example 1-1 exhibits an increase in a luminous efficiency by at least about 65% in comparison with the light-emitting film of Comparative Example 1. Example 1-1 also exhibits a significantly increased luminous efficiency in comparison with the light-emitting film of Comparative Example 2-1.

Experimental Example 2

The films obtained from Comparative Examples 1, 2-1, 2-2 and Example 1-1 and the film of ZnMgO particles obtained from Reference Example 2 are measured for a HOMO level and a LUMO level. The results are shown in Table 1.

TABLE 1

|  | HOMO (eV) | Energy Bandgap (eV) | LUMO (eV) |
|---|---|---|---|
| Comparative Example 1 | 5.5 | 2.7 | 2.8 |
| Comparative Example 2-1 | 5.9 | 2.7 | 3.2 |
| Comparative Example 2-2 | 5.9 | 2.7 | 3.2 |
| Example 1-1 | 6.1 | 2.7 | 3.4 |
| Reference Example 2 |  |  | 4.3 |

From the results of Table 1, it is confirmed that the light-emitting film treated by a fluorine organic salt from Example 1 has higher HOMO and LUMO absolute values than the light-emitting films of Comparative Examples 1, 2-1, and 2-2. From the results of measuring the LUMO level, it is confirmed that the ZnMgO film has a LUMO (i.e., the conduction band edge) energy level of 4.3 eV. It is also confirmed that the LUMO difference between the light-emitting film of Example 1 and the ZnMgO film is 0.9 eV.

Experimental Example 3

The films obtained from Comparative Example 1 and Example 1-1 are performed with a SEM-EDX analysis. The results are shown in Table 2.

TABLE 2

|  | EDX content (atomic %) | |
|---|---|---|
|  | Example 1 | Comparative Example 1 |
| boron | 9.12 | — |
| carbon | 9.82 | 14.73 |
| fluorine | 0.32 | — |

From the results of Table 2, it is confirmed that fluorine and boron are detected in the light-emitting film treated by a fluorine organic salt in Example 1.

Experimental Example 4: PL Change after Thermal Shock

The films of Comparative Examples 1 and 2-2 and Example 1 are heat-treated at 120° C. for 30 minutes under a nitrogen atmosphere. The photoluminescence analysis (spectrum) of each film, before the heat treatment and after the heat treatment, a is obtained, and the change of the luminous efficiency of each film resulting from the heat treatment is measured.

TABLE 3

|  | Baking at 120° C. for 30 min Relative PL efficiency |
|---|---|
| Comparative Example 1 (OA) | 86% |
| Comparative Example 2-2 ($ZnCl_2$) | 93% |
| Example 1-1 | 97% |

From the results, it is confirmed that the light-emitting film of Example 1 shows improved thermal stability compared to the light-emitting films of Comparative Examples 1 and 2-2.

Experimental Example 5

The light-emitting films according to Comparative Examples 1 and 2-2 and Examples 1-1 to 1-3 are measured for a hole transport capability, and the results are shown in Table 4.

TABLE 4

|  | Current density ($mA/cm^2$) at 8 volts |
|---|---|
| Comparative Example 1 (OA) | 0.22 |
| Comparative Example 2-2 ($ZnCl_2$) | 226 |
| Example 1-1, $Me_3O\ BF_4$ | 603 |
| Example 1-2, $Et_4N\ BF_4$ | 479 |
| Example 1-3, $Et_3O\ PF_6$ | 749 |

From the results, it is confirmed that the current density for each film of Example 1 increases significantly by substituting a ligand with the corresponding fluorine containing organic salt in the light-emitting films of Examples 1-1, 1-2, and 1-3. Accordingly, it is understood that an embodied light-emitting device including the light-emitting films of Example 1 has a low driving voltage, and such results also suggest that the light-emitting films of the examples may exhibit increased hole conductivity.

Experimental Example 6

Scanning electron microscope energy dispersive spectroscopy is performed on the light-emitting films according to Comparative Example 1 and Example 1-1, and the results are shown in Table 5.

TABLE 5

| EDX mole ratio | Comparative Example 1 | Example 1-1 |
|---|---|---|
| B/C | 0/14.73 | 9.12/9.82 = 0.92 |
| F/C | 0/14.73 | 0.32/9.82 = 0.03 |

Example 2

The light-emitting device having ITO/PEDOT:PSS/TFB/$Me_3OBF_4$ treated light-emitting film/ZnMgO/Al structure is fabricated according to the following method.

An ethanol solution of Me₃OBF₄ (concentration: 100 g/L) is prepared. An ITO-deposited glass substrate is surface treated with UV-ozone for 15 minutes. A PEDOT:PSS solution (H.C. Starks) is spin-coated on the treated glass substrate, which is then heat-treated at 150° C. under an air atmosphere for 10 minutes followed by a heat treatment at 150° C. under a $N_2$ atmosphere for 20-30 minutes to provide a hole injecting layer (HIL) having a thickness of 30 nm. Subsequently, a poly[(9,9-dioctylfluorenyl-2,7-diyl-co(4,4'-(N-4-butylphenyl)diphenylamine] solution (TFB) (Sumitomo) is spin-coated on the hole injecting layer (HIL) and heat-treated at 150° C. for 30 minutes to provide a hole transporting layer (HTL) having a thickness of 25 nm.

The quantum dot solution obtained from Reference Example 1 is spin-coated on the HTL to provide a film, which is then washed with ethanol and heat-treated at 80° C. for 30 minutes to provide a quantum dot layer having a thickness of 25 nm.

The $Me_3OBF_4$ solution (above) is added in a dropwise fashion on the heat-treated quantum dot layer, and after 1 minute, the obtained film is spun to remove any excess or remaining solution and washed with ethanol. The washed layer is heat-treated at 80° C. for 30 minutes to provide a light-emitting film.

A solution of ZnMgO nanoparticles of Reference Example 2 is spin-coated on the light-emitting film and heat-treated at 80° C. for 30 minutes to provide an electron transporting layer (ETL). 100 nm of aluminum (Al) is vacuum-deposited on the ETL to provide a second electrode. The electroluminescent properties of the obtained device are evaluated, and the results are shown in Table 6.

Comparative Example 3

A light-emitting device having a structure of ITO/PEDOT:PSS/TFB/ZnCl₂ treated light-emitting film/ZnMgO/Ag is fabricated in accordance with the same procedure as in Example 2, except that a ZnCl₂ ethanol solution (concentration: 100 g/L) is used instead of the (Me₃OBF₄) solution during forming the light-emitting layer. The electroluminescent properties are evaluated for the obtained device, and the results are shown in Table 3.

Comparative Example 4

A light-emitting device having a structure of ITO/PEDOT:PSS/TFB/ZnBF₄ treated light-emitting film/ZnMgO/Al is fabricated in accordance with the same procedure as in Example 2, except that a Zn(BF₄)₂ ethanol solution (concentration: 100 g/L) is used instead of the Me₃OBF₄ solution during forming the light-emitting film. The electroluminescent properties of the formed device are evaluated, and the results are shown in Table 6.

TABLE 6

|  | Light-emitting film | Lum Max (cd/m²) | EQE Max % | Cd/A Max | T95 (hr) | T50 (hr) |
|---|---|---|---|---|---|---|
| Example 2 | Me₃OBF₄ treatment | 44320 | 10.8 | 7.3 | 5.42 | 45.5 |
| Comparative Example 3 | Ref (ZnCl₂) | 24380 | 8.9 | 5.5 | 1.05 | 13.8 |
| Comparative Example 4 | Zn(BF₄)₂ | 33250 | 12.3 | 7.1 | 0.81 | 22.7 |

From the results of Table 6, it is confirmed that the device according to Example 2 shows an increased life-span together with remarkably increased luminance and efficiency compared to the devices according to Comparative Examples 3 and 4.

Example 3

A light-emitting device having a structure of ITO/PEDOT:PSS/TFB/Et₄NBF₄ treated light-emitting film/ZnMgO/Al is fabricated in accordance with the same procedure as in Example 2, except that a Et₄NBF₄ ethanol solution (concentration: 5 g/L) is used instead of the (Me₃OBF₄) solution during the formation of the light-emitting film.

Example 4

A light-emitting device having a structure of ITO/PEDOT:PSS/TFB/Et₃OPF₆ treated light-emitting film/ZnMgO/Al is fabricated in accordance with the same procedure as in Example 2, except that a Et₃OPF₆ ethanol solution (concentration: 100 g/L) is used instead of the (Me₃OBF₄) solution during the formation of the light-emitting film.

Comparative Example 5

A light-emitting device having a structure of ITO/PEDOT:PSS/TFB/Nitrosyl BF₄ treated light-emitting film/ZnMgO/Al is fabricated in accordance with the same procedure as in Example 2, except that a Nitrosyl BF₄ ethanol solution (concentration: 100 g/L) is used instead of the (Me₃OBF₄) solution during the formation of the light-emitting layer. The electroluminescent properties of the formed device are evaluated, and the results are shown in Table 7.

Comparative Example 6

A light-emitting device having a structure of ITO/PEDOT:PSS/TFB/HBF₄ treated light-emitting film/ZnMgO/Al is fabricated in accordance with the same procedure as in Example 2, except that a HBF₄ ethanol solution (concentration: 100 g/L) is used instead of the Me₃OBF₄ solution during the formation of the light-emitting film. The electroluminescent properties of the formed device are evaluated, and the results are shown in Table 7.

Experimental Example 6

The devices according to Examples 2 to 4 and the light-emitting device according to Comparative Example 3-6 are measured for T50, and the results are shown in Table 7.

TABLE 7

|  | Light-emitting film | T50 (hr) |
|---|---|---|
| Comparative Example 3 | ZnCl₂ | 13.8 |
| Comparative Example 4 | Zn (BF₄)₂ | 22.7 |
| Comparative Example 5 | Nitrosyl BF₄ | 4.7 |
| Comparative Example 6 | H BF₄ | LED is not operated |
| Example 2 | Me₃O BF₄ | 45.5 |
| Example 3 | Et₄N BF₄ | 34.9 |
| Example 4 | Et₃O PF₆ | 52.0 |

From the results of Table 7, it is confirmed that the light-emitting devices according to Examples may exhibit improved life-span characteristics compared to the light-emitting devices according to Comparative Examples.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: light-emitting device
11: first electrode
12: hole auxiliary layer
13: light-emitting film
14: electron auxiliary layer
15: second electrode

What is claimed is:

1. A light-emitting device comprising
a first electrode, a second electrode, and a light-emitting film disposed between the first electrode and the second electrode, wherein the light-emitting film comprises a fluorine-containing onium salt and quantum dots,
wherein the quantum dots do not comprise cadmium, lead, or a combination thereof, or hafnium, zirconium, titanium, or a combination thereof,
wherein the onium salt comprises a carbonium moiety, an oxonium moiety, a selenonium moiety, or a combination thereof, with a substituted or unsubstituted C1 to C30 hydrocarbon group, fluorine, and at least one of boron or phosphorus, and
wherein the onium salt is bound to the quantum dots.

2. The light-emitting device of claim 1, wherein at least a portion of a surface of the light-emitting film comprises the quantum dots.

3. The light-emitting device of claim 1, wherein a HOMO energy level of the light-emitting film is greater than or equal to about 5.7 eV.

4. The light-emitting device of claim 1, wherein the light-emitting film is configured to emit red light, green light, or blue light.

5. The light-emitting device of claim 4, wherein
if the light-emitting film emits red light, the HOMO energy level of the light-emitting film is greater than or equal to about 5.7 eV;
if the light-emitting film emits green light, the HOMO energy level of the light-emitting film is greater than or equal to about 5.7 eV; or
if the light-emitting film emits blue light, the HOMO energy level of the light-emitting film is greater than or equal to about 5.9 eV.

6. The light-emitting device of claim 1, wherein the fluorine-containing onium salt comprises the oxonium moiety, with a substituted or unsubstituted C1 to C15 hydrocarbon group.

7. The light-emitting device of claim 1, wherein the fluorine-containing onium salt comprises fluoroborate, fluorophosphate, or a combination thereof.

8. The light-emitting device of claim 1, wherein the quantum dots comprise a core comprising a first semiconductor nanocrystal and a shell disposed on the core, the shell comprising a second semiconductor nanocrystal having a composition different from that of the first semiconductor nanocrystal.

9. The light-emitting device of claim 1, wherein
the light-emitting film is configured to emit red light and a HOMO energy level of the light-emitting film is greater than or equal to about 5.7 eV;
the light-emitting film is configured to emit green light and a HOMO energy level of the light-emitting film is greater than or equal to about 5.85 eV; or
the light-emitting film is configured to emit blue light and a HOMO energy level of the light-emitting film is greater than or equal to about 6 eV.

10. The light-emitting device of claim 1, wherein the light-emitting film comprises boron and a mole ratio of boron relative to carbon is greater than or equal to about 0.001:1, as determined by energy dispersive spectroscopy of the light-emitting film.

11. The light-emitting device of claim 1, wherein the light-emitting film comprises boron and a mole ratio of fluorine relative to boron is greater than or equal to about 4:1 and less than or equal to about 6:1.

12. The light-emitting device of claim 1, wherein the light-emitting device further comprises an electron auxiliary layer between the light emitting layer and the second electrode and wherein the electron auxiliary layer comprises nanoparticles of a metal oxide.

13. The light-emitting device of claim 1, wherein the light-emitting film has a thickness of greater than or equal to about 10 nanometers and less than or equal to about 100 nanometers.

14. The light-emitting device of claim 1, wherein a maximum external quantum efficiency of the light-emitting device is greater than or equal to about 10% and
wherein a maximum luminance of the light-emitting device is greater than or equal to about 35,000 $cd/m^2$.

15. The light-emitting device of claim 1, wherein the light emitting device exhibits a life time of T95 that is greater than or equal to about 2 hours as determined under the operation at a luminance of about 650 candela per square meter.

16. A display device comprising the light-emitting device of claim 1.

17. A light-emitting device comprising;
an anode, a cathode, and a light-emitting film disposed between the anode and the cathode, wherein the light-emitting film comprises a fluorine-containing onium salt, and quantum dots that do not comprise cadmium, lead, or a combination thereof,
wherein the fluorine-containing onium salt comprises a carbonium moiety, an oxonium moiety, a selenonium moiety, or a combination thereof, with a substituted or unsubstituted C1 to C30 hydrocarbon group, fluorine, and boron, and
wherein the light-emitting device further comprises an electron auxiliary layer between the light emitting layer and the cathode and wherein the electron auxiliary layer comprises nanoparticles of a metal oxide.

18. The light-emitting device of claim 17, wherein a difference between a conduction band edge of the electron auxiliary layer and a LUMO level of the light-emitting film is less than or equal to about 1 eV.

19. A light-emitting film comprising
a plurality of quantum dots that do not comprise cadmium, lead, or a combination thereof, and
a fluorine-containing onium salt bound to the quantum dots,
wherein the fluorine-containing onium salt comprises an oxonium, a carbonium, a selenonium, or a combination thereof, with a substituted or unsubstituted C1 to C30 hydrocarbon group, and a tetrafluoroborate, hexafluorophosphate, or a combination thereof.

20. The light-emitting film of claim 19, wherein the first moiety comprises a substituted or unsubstituted C1 to C15, hydrocarbon group.

21. The light-emitting film of claim 19, wherein
the light-emitting film is configured to emit red light, green light, or blue light, and
if the light-emitting film emits red light, the HOMO energy level of the light-emitting film is greater than or equal to about 5.7 eV,
if the light-emitting film emits green light, the HOMO energy level of the light-emitting film is greater than or equal to about 5.7 eV, or
if the light-emitting film emits blue light, the HOMO energy level of the light-emitting film is greater than or equal to about 5.9 eV.

22. The light-emitting film of claim 19, wherein the light-emitting film comprises boron, and a mole ratio of boron relative to carbon is greater than or equal to about 0.001:1, as determined by energy dispersive spectroscopy of the light-emitting film.

* * * * *